(12) United States Patent
Yan et al.

(10) Patent No.: US 12,184,253 B2
(45) Date of Patent: Dec. 31, 2024

(54) FILTER RADIO FREQUENCY MODULE PACKAGING STRUCTURE AND METHOD FOR MANUFACTURING SAME

(71) Applicant: INSTITUTE OF SEMICONDUCTORS, GUANGDONG ACADEMY OF SCIENCES, Guangzhou (CN)

(72) Inventors: Yingqiang Yan, Guangzhou (CN); Chuan Hu, Guangzhou (CN); Xun Xiang, Guangzhou (CN); Wei Zheng, Guangzhou (CN); Zhitao Chen, Guangzhou (CN); Zhikuan Chen, Guangzhou (CN)

(73) Assignee: Institute of Semiconductors, Guangdong Academy of Sciences, Guangzhou (CN)

( * ) Notice: Subject to any disclaimer, the term of this patent is extended or adjusted under 35 U.S.C. 154(b) by 0 days.

(21) Appl. No.: 18/038,371

(22) PCT Filed: Jul. 27, 2021

(86) PCT No.: PCT/CN2021/108557
§ 371 (c)(1),
(2) Date: May 23, 2023

(87) PCT Pub. No.: WO2022/267163
PCT Pub. Date: Dec. 29, 2022

(65) Prior Publication Data
US 2024/0007072 A1    Jan. 4, 2024

(30) Foreign Application Priority Data
Jun. 21, 2021 (CN) .......................... 202110687872.X

(51) Int. Cl.
*H03H 1/00* (2006.01)

(52) U.S. Cl.
CPC ... *H03H 1/0007* (2013.01); *H03H 2001/0021* (2013.01)

(58) Field of Classification Search
CPC .................................................... H03H 1/0007
USPC ............................................................ 327/552
See application file for complete search history.

(56) References Cited

U.S. PATENT DOCUMENTS

| | | | |
|---|---|---|---|
| 10,293,693 B2 | 5/2019 | Kim et al. | |
| 2017/0316994 A1* | 11/2017 | Hoegerl | H01L 24/05 |
| 2021/0184649 A1 | 6/2021 | Yan et al. | |

FOREIGN PATENT DOCUMENTS

| | | |
|---|---|---|
| CN | 104868872 | 8/2015 |
| CN | 105281706 | 1/2016 |
| CN | 106067457 | 11/2016 |
| CN | 106067567 | 11/2016 |

(Continued)

*Primary Examiner* — Tomi Skibinski
(74) *Attorney, Agent, or Firm* — Dicke, Billig & Czaja, PLLC

(57) ABSTRACT

A filter radio frequency module packaging structure and a method for manufacturing same is disclosed. A first filter chip of the filter radio frequency module packaging structure comprises a chip main body and a wall structure. The wall structure, the functional surface, and a substrate together define a closed cavity, or the wall structure and the functional surface together define a closed cavity. An encapsulation material wraps the first filter chip.

18 Claims, 4 Drawing Sheets

(56) References Cited

FOREIGN PATENT DOCUMENTS

| CN | 207637845 | 7/2018 |
| CN | 108711569 | 10/2018 |
| CN | 109087911 | 12/2018 |
| CN | 109244230 | 1/2019 |
| CN | 109244231 | 1/2019 |
| CN | 208507673 | 2/2019 |
| CN | 110957992 | 4/2020 |

* cited by examiner

FILTER RADIO FREQUENCY MODULE PACKAGING STRUCTURE AND METHOD FOR MANUFACTURING SAME

CROSS-REFERENCE TO RELATED APPLICATIONS

This Utility Patent Application claims priority under 35 U.S.C. § 371 to International Application Serial No. PCT/CN2021/108557, filed Jul. 27, 2021, which claims priority to Chinese Patent Application No. 202110687872.X, filed with the Chinese Patent Office on Jun. 21, 2021, entitled "FILTER RADIO FREQUENCY MODULE PACKAGING STRUCTURE AND METHOD FOR MANUFACTURING SAME," both of which are incorporated herein by reference in their entirety.

TECHNICAL FIELD

This application relates to the field of semiconductors, and in particular to a filter radio frequency module packaging structure (i.e., a filter radio-frequency module packaging structure) and a method for manufacturing same (i.e., a manufacturing method thereof).

BACKGROUND ART

With the development of 4G and 5G communication technologies, the complexity of the radio-frequency front end is getting higher and higher, and higher requirements are put forward on the architecture, design, and manufacturing of the terminal radio-frequency front end: 1) simplifying the design; 2) miniaturizing the product; 3) reducing energy consumption; 4) improving system performance; and 5) reducing the cost of radio frequency solutions, helping customers to quickly introduce new ones. It is an inevitable trend of technology development to integrate and package filters, radio frequency switches, PA (power amplifier), LNA (low noise amplifier), duplexers, antennas, etc. together to form a radio-frequency front end module. The traditional integrated packaging method of the radio-frequency module of the radio-frequency front end is: using flip chip, wire bonding, surface mount technology to attach the packaged filter and the packaged radio frequency switch, PA, LNA, duplexer, antenna and other components to the substrate to obtain a radio-frequency module device by integrated packaging, but the size and thickness are large, the power consumption is high, and the system performance is poor. Forming a radio-frequency front end module is an inevitable trend of technological development.

SUMMARY

The purpose of this application includes, for example, to provide a filter radio-frequency module packaging structure and a manufacturing method thereof, which can ensure that the filter radio-frequency module packaging structure has better performance and smaller encapsulating material volume.

The embodiments of this application can be implemented as follows.

In the first aspect, the present application provides a filter radio-frequency module packaging structure, including a substrate, an encapsulating material, and at least two chips with different functions.

The chips with different functions include a first filter chip, a packaging circuit is arranged on the substrate, and the first filter chip includes a chip body and a wall structure arranged on the chip body of the first filter.

The chip body of the first filter has a functional area provided to realize the filtering function, the functional area is located on the functional surface of the chip body of the first filter, and the chip pin of the first filter is also provided on the functional surface.

The first filter chip is flip-mounted on the substrate and the chip pins are electrically connected to the packaging circuit on the substrate.

The wall structure is arranged on the functional surface of the chip body, and the wall structure, the functional surface and the substrate jointly form a closed cavity, or the wall structure and the functional surface jointly form a closed cavity.

The chips with different functions also include non-filter chips, and the non-filter chips are electrically connected to the packaging circuit on the substrate through flip-mounting or wire bonding processes.

The encapsulating material and the substrate encapsulate chips with different functions.

In an optional embodiment, the first filter chip is flip-mounted on the substrate, the chip pins of the first filter chip are connected to the packaging circuit on the surface of the substrate through bumps, and the wall structure includes a dam protruding from the functional surface, wherein the dam forms a cavity with an opening, and the side of the dam away from the chip body abuts against the substrate, so that the substrate blocks the opening of the cavity. The dam, the functional surface, the encapsulating material and the substrate form a closed cavity together.

In an optional embodiment, the first filter chip includes a plurality of filter device functions.

In an optional embodiment, the encapsulating material is formed by transfer molding, die-casting molding, injection molding, or vacuum coating processes.

In an optional embodiment, the substrate includes a first surface and a second surface opposite to each other, and the packaging circuit on the substrate includes a first circuit layer located on the first surface and a second circuit layer located on the second surface, and the dam abuts against the first circuit layer, the bumps are connected to the first circuit layer.

In an optional embodiment, the substrate includes a first surface and a second surface opposite to each other, the circuit on the substrate includes a first circuit layer located on the first surface and a second circuit layer located on the second surface, and the first filter chip is arranged on the first surface of the substrate, and the substrate further includes an insulating protection layer laid on the first circuit layer and the second circuit layer, and at least a part of the circuits of the first circuit layer and the second circuit layer is exposed from the insulating protection layer.

In an optional embodiment, the flatness of the insulating protection layer is 0-10 microns.

In an optional embodiment, the chips with different functions further include a second filter chip electrically connected to the packaging circuit on the substrate, and a closed cavity is formed at the functional surface of the second filter chip.

In an optional embodiment, the substrate includes a first surface and a second surface opposite to each other, and the packaging circuit on the substrate includes a first circuit layer located on the first surface and a second circuit layer located on the second surface. An insulating protection layer is laid on the first surface, and a groove is formed on the insulating protection layer to expose at least part of the packaging circuit and a part of the substrate surface. The second filter chip is flip-mounted on the first surface, the pins on the functional surface of the second filter chip are connected to the packaging circuits exposed by the grooves through bumps, and a part of the functional surface of the second filter chip abuts against the insulating protection layer, the other part forms a closed cavity together with the substrate surface exposed from the groove, the sidewall of the groove, and the encapsulating material.

In an optional embodiment, the non-filter chip is a power amplifier, a radio frequency switch, a low noise amplifier, a filter duplexer, or a power amplifier.

In the second aspect, an embodiment of the present application provides a manufacturing method of a filter radio-frequency module packaging structure, which includes the following steps:

- obtaining a substrate, wherein a packaging circuit is provided on the substrate;
- obtaining the non-filter chip, and electrically connecting the non-filter chip with the packaging circuit on the substrate through flip-mounting or wire bonding processes;
- obtaining the chip body of the first filter chip, wherein the chip body has a functional area provided to realize the filtering function, the functional area is located on the functional surface of the chip body, and the chip pins are also provided on the functional surface;
- fabricating a wall structure on the functional surface of the chip body to obtain the first filter chip, and making the wall structure form a cavity;
- flip-mounting the first filter chip on the substrate so that the chip pins are electrically connected to the packaging circuit on the substrate. The wall structure and functional surface of the first filter chip and substrate collectively form a closed cavity, or the wall structure and the functional surface jointly form a closed cavity; and
- wrapping each chip with an encapsulating material.

In an optional embodiment, the wall structure includes a dam protruding from the functional surface, and the dam forms a cavity with an opening; the flip-mounting the first filter chip on the substrate so that the chip pins are electrically connected to the packaging circuit includes:

- flip-mounting the first filter chip on the substrate, using the bumps to connect the chip pins of the chip body and the packaging circuit on the substrate, wherein the side of the dam away from the chip body abuts against the substrate, so that the substrate blocks the opening of the cavity, and the dam, the functional surface and the substrate jointly form a closed cavity.

In an optional embodiment, the wall structure includes a dam protruding from the functional surface and a cover connected to the dam. The dam forms a cavity with an opening, and the cover covers the opening of the cavity so that the dam, the cover and the functional surface jointly form a closed cavity.

In an optional embodiment, the encapsulating material is wrapped on the outside of each chip by using transfer molding, die-casting molding, injection molding or vacuum coating processes.

In an optional embodiment, the obtaining a substrate further includes:

- fabricating an insulating protection layer to selectively cover the packaging circuit.

BRIEF DESCRIPTION OF DRAWINGS

In order to more clearly illustrate technical solutions in the embodiments of the present application, an accompanying drawing which needs to be used in the embodiments will be introduced briefly below, and it should be understood that the accompanying drawing below merely shows some embodiments of the present application, and therefore should not be considered as limitation to the scope, a person ordinarily skilled in the art still could obtain other relevant drawings according to these accompanying drawings, without using creative efforts.

Figure 1:
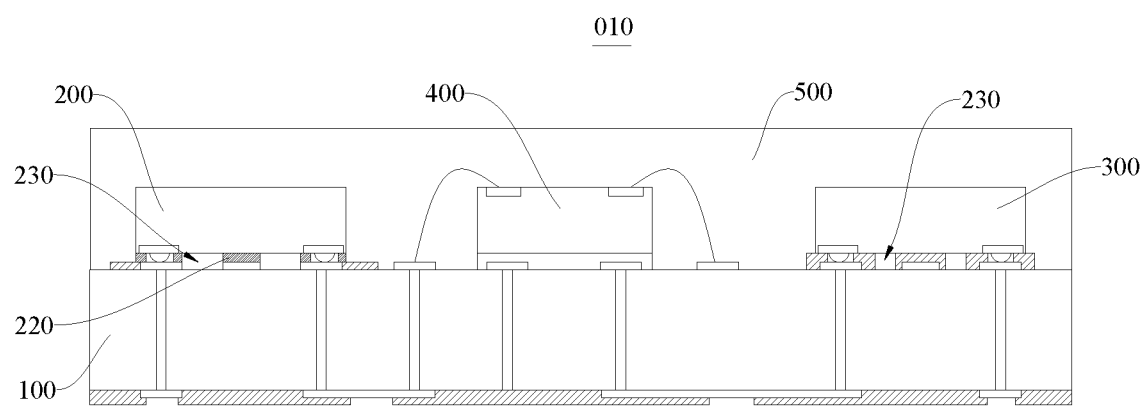
FIG. 1 is a schematic diagram of a filter radio-frequency module packaging structure in an embodiment of the present application.

Description of reference signs: 010—filter radio-frequency module packaging structure; 100—substrate; 110—first circuit layer; 120—second circuit layer; 130—first insulating protection layer; 132—groove; 140—second insulating protection layer; 200—first filter chip; 210—chip body; 212—chip pin; 214—bump; 220—wall structure; 222—dam; 224—cover; 230—cavity; 300—second filter chip; 400—non-filter chip; 500—encapsulating material.

DETAILED DESCRIPTION OF EMBODIMENTS

In order to make the objectives, technical solutions and advantages of the embodiments of the present application clearer, the technical solutions in the embodiments of the present application will be described clearly and completely below in combination with the accompanying drawings of the embodiments of the present application, apparently, the embodiments described are some but not all embodiments of the present application. The components of the embodiments of the present application generally described and shown in the drawings herein may be arranged and designed in various different configurations.

Therefore, the following detailed description of the embodiments of the present application provided in the accompanying drawings is not intended to limit the claimed scope of the present application, but merely represents selected embodiments of the present application. Based on the embodiments in this application, all other embodiments obtained by those of ordinary skill in the art without creative work shall fall within the protection scope of this application.

It should be noted that similar reference numerals and letters indicate similar items in the following drawings. Therefore, once a certain item is defined in one drawing, it does not need to be further defined and explained in the subsequent drawings.

In the description of the present application, it should be indicated that the terms such as "up", "down", "inside", and "outside", if present, indicate the orientation or positional relationships shown based on the drawings, or the orientation or positional relationships in which the inventive product is conventionally placed in use, and these terms are intended only to facilitate the description of the present application and simplify the description, but not intended to indicate or imply that the referred devices or elements must be in a particular orientation or constructed or operated in the particular orientation, and therefore should not be construed as limiting the present disclosure.

In addition, the terms such as "first", "second", if present, are only used for distinguishing description, and cannot be understood as indicating or implying relative importance.

It should be noted that, in the case of no conflict, the features in the embodiments of the present application can be combined with each other.

FIG. 1 is a schematic diagram of a filter radio-frequency module packaging structure 010 in an embodiment of the present application. Please refer to FIG. 1, this embodiment provides a filter radio-frequency module packaging structure 010 (i.e., a packaging structure for a filter radio-frequency module), which includes a substrate 100, at least two chips with different functions, and an encapsulating material 500. In the embodiment of the present application, at least two chips with different functions include a first filter chip 200, a second filter chip 300, and a non-filter chip 400. A packaging circuit is provided on the substrate 100, and the respective pins of the first filter chip 200, the second filter chip 300, and the non-filter chip 400 are electrically connected to the packaging circuit on the substrate 100 and are all located on the same side of the substrate 100. The encapsulating material 500 wraps the first filter chip 200, the second filter chip 300, and the non-filter chip 400 to protect and fix each chip. Both the first filter chip 200 and the second filter chip 300 are surface acoustic wave (SAW) filter chips or bulk acoustic wave (BAW) chips, and the non-filter chip 400 may be a power amplifier, a radio frequency switch, a low noise amplifier, and a filter duplexer or power amplifier. Optionally, the number of non-filter chips 400 and second filter chips 300 can be increased or decreased as required.

Figure 2:
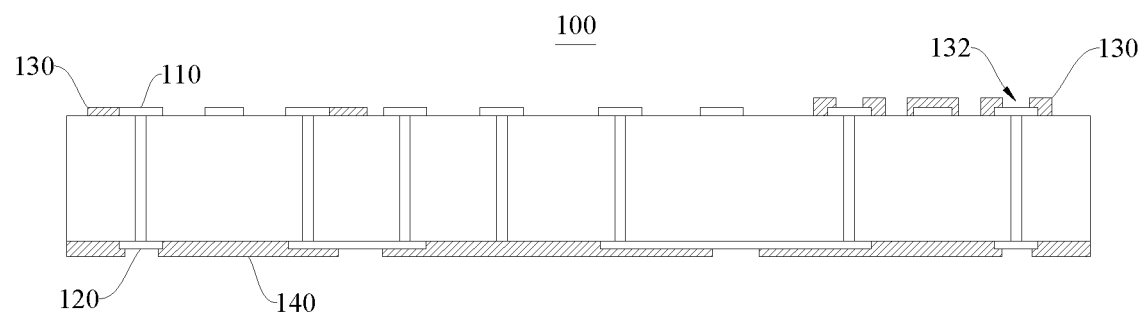
FIG. 2 is a schematic diagram of a substrate in an embodiment of the present application.

FIG. 2 is a schematic diagram of the substrate 100 in an embodiment of the present application. As shown in FIG. 2, in this embodiment, the substrate 100 has a first surface and a second surface opposite to each other. The packaging circuit on the substrate 100 includes a first circuit layer 110 located on the first surface and a second circuit layer 120 located on the second surface, the first circuit layer 110 and the second circuit layer 120 are exposed from the surface of the substrate 100 and arranged to be connected to the chip. In this embodiment, both the first surface and the second surface of the substrate 100 are laid with an insulating protection layer. At least a part of the circuits of the first circuit layer 110 and the second circuit layer 120 are exposed from the insulating protection layer. In this embodiment, for the convenience of description, the insulating protection layer covering the first surface is the first insulating protection layer 130, and the insulating protection layer covering the second surface is the second insulating protection layer 140. The first insulating protection layer 130 is laid in the circuit gap of the first circuit layer 110, or covers a part of the circuit surface, and the second insulating protection layer 140 covers most of the second surface of the substrate 100. In this embodiment, the second insulating protection layer 140 covers the circuit gap and a part of the circuits of the second circuit layer 120, and only exposes a part of the circuits of the second circuit layer 120. In the embodiment of the present application, the flatness of the insulating protection layer is 0-10 microns.

Of course, optionally, the first surface of the substrate 100 may not be provided with an insulating protection layer, and only the second surface of the substrate 100 is provided with a second insulating protection layer 140.

Figure 3:
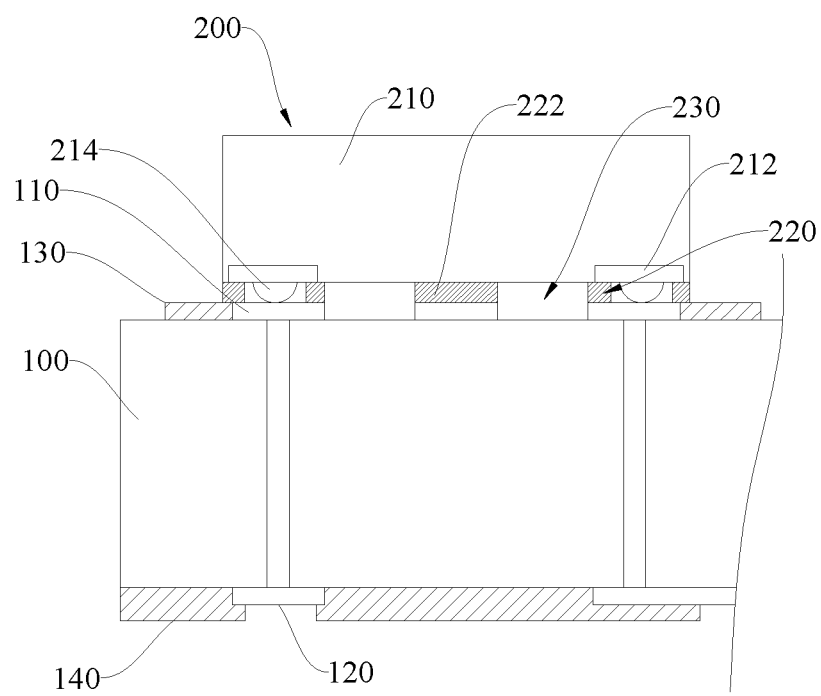
FIG. 3 is a schematic diagram of a first filter chip disposed on a substrate in an embodiment of the present application.

FIG. 3 is a schematic diagram of the first filter chip 200 disposed on the substrate 100 in an embodiment of the present application. The arrangement of the first filter chip 200 shown in FIG. 3 is the arrangement of the first filter chip 200 in FIG. 1. As shown in FIG. 3, the first filter chip 200 includes a chip body 210 and a wall structure 220 arranged on the chip body 210. The first filter chip body 210 has a functional area configured to realize the filtering function, and the first filter chip body 210 is the chip body 210 of the first filter chip 200. The functional area is located on the functional surface of the first filter chip body 210. The functional surface is also provided with chip pins 212. The chip pins 212 are electrically connected to the packaging circuit on the substrate 100; and the wall structure 220 is provided on the functional surface of the chip body 210. It should be understood that the filter chip realizes its function through the interdigital transducer, which is arranged on the side where the functional surface is located. Reference can be made on the related introduction of the prior art, which will not be described here. In the embodiment of FIG. 3, the functional area and the functional surface are located on the side of the chip body 210 facing the substrate 100, and the wall structure 220, the functional surface and the substrate 100 collectively enclose a closed cavity 230. Optionally, the wall structure 220 and the functional surface can also be used to jointly enclose a closed cavity 230 (as shown in FIG. 4).

As shown in FIG. 3, the first filter chip 200 is flip-mounted on the substrate 100 so that the chip pins 212 are electrically connected to the packaging circuit on the substrate 100, that is, the chip pins 212 and the functional surface face the first surface of the substrate 100. The chip pins 212 of the first filter chip 200 are connected to the packaging circuit on the surface of the substrate 100 through bumps 214. The wall structure 220 includes a dam 222 protruding from the functional surface, and the dam 222 encloses a cavity with an opening. The side of the dam 222 away from the chip body 210 abuts against the substrate 100 so that the substrate 100 blocks the opening of the cavity. The dam 222, the functional surface and the substrate 100 jointly enclose a closed cavity 230.

In this embodiment, the dam 222 specifically abuts on the first circuit layer 110 of the substrate 100, and the bump 214 is connected to the first circuit layer 110.

Figure 4:
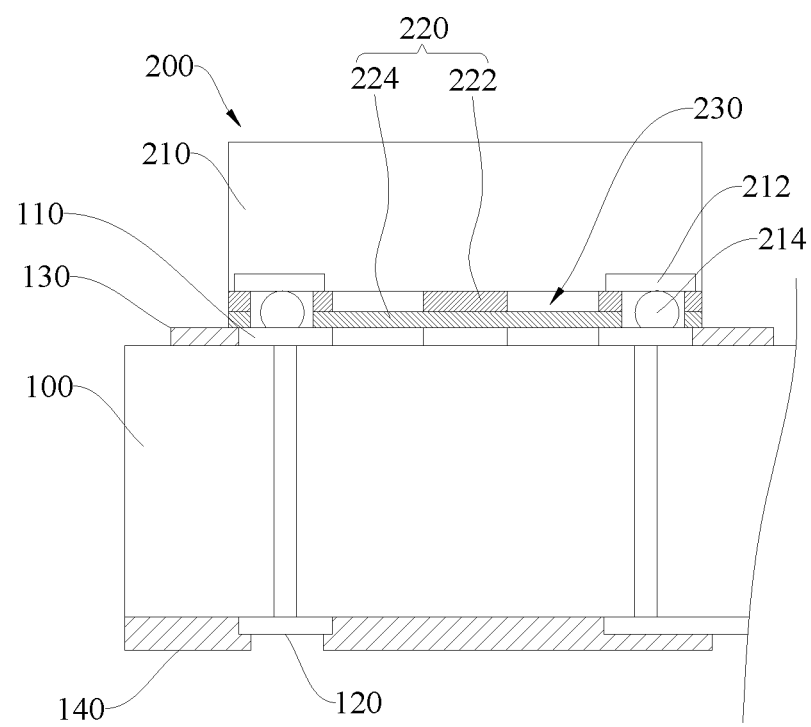
FIG. 4 is a schematic diagram of a first filter chip disposed on a substrate in an embodiment of the present application.

FIG. 4 is a schematic diagram of the first filter chip 200 disposed on the substrate 100 in an embodiment of the present application. The difference from FIG. 3 is that the wall structure 220 shown in FIG. 4 includes a dam 222 protruding from the functional surface and a cover 224 connected to the dam 222. The dam 222 encloses a cavity with an opening. The cover 224 covers the opening of the cavity so that the dam 222, the cover 224 and the functional surface jointly enclose a closed cavity 230. As shown in FIG. 4, the cover 224 abuts on the substrate 100, specifically abuts on the first circuit layer 110 of the substrate 100 (optionally, also abuts on the first insulating layer). It should be noted that the cover 224 of the wall structure 220 exposes the chip pins 212 of the first filter chip 200 to arrange bumps 214. The height of the bump 214 is sufficient to connect the chip pin 212 and the first circuit layer 110 when the cover 224 abuts against the first circuit layer 110, to realize signal transmission.

Figure 5:
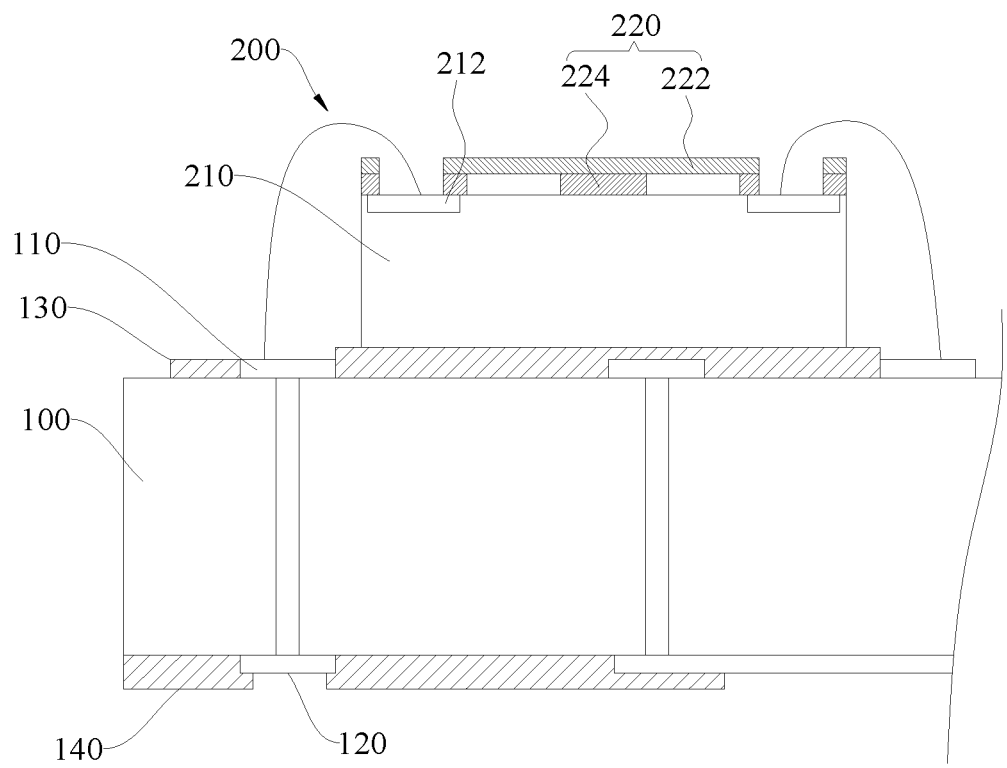
FIG. 5 is a schematic diagram of a first filter chip disposed on a substrate in an embodiment of the present application.

FIG. 5 is a schematic diagram of the first filter chip 200 disposed on the substrate 100 in an embodiment of the present application. As shown in FIG. 5, the wall structure 220 is the same as the wall structure 220 in FIG. 4. The difference from FIG. 4 is that the first filter chip 200 is directly mounted on the first surface of the substrate 100, and is electrically connected to the packaging circuit (which may be the first circuit layer 110) on the substrate 100 through wiring method (i.e., wire bonding process).

In the embodiments of FIGS. 3 to 5, the closed cavity 230 is realized by the wall structure 220 to realize the filtering function. The first filter chip 200 may be either a front-mounted or flip-mounted. Since the wall structure 220 is used to realize the cavity 230, it can prevent the encapsulating material 500 from entering the wall and affecting the chip performance, meanwhile, it also avoids the problem that the encapsulating material 500 is too large in volume and the encapsulation process is complicated when the coating is used to prevent the encapsulating material 500 from entering the cavity 230 during the encapsulation process. The wall structure 220 can be completed during the chip manufacturing process. In this embodiment, the wall structure 220 of the first filter chip 200 is made of insulating material, specifically made of insulating photosensitive material. The encapsulating material 500 is formed by transfer molding, die-casting molding, injection molding, or vacuum coating process.

In this embodiment, the first filter chip 200 includes multiple filter device functions.

As shown in FIG. 1, the non-filter chip 400 is not a surface acoustic wave filter chip or a body surface wave filter chip, and it does not need to form a closed cavity. Therefore, its setting method can be in accordance with the conventional setting method, and it is arranged on the substrate 100 by adopting the front-mounting and the wire bonding processes, or arranged on the substrate 100 by a flip-chip method.

The second filter chip 300 and the first filter chip 200 have similar functions to be realized, so it can adopt the structure and setting method of the first filter chip 200 (refer to the setting method in the embodiments of FIG. 3 to FIG. 5). Of course, other setting methods can also be used, such as setting methods in the prior art.

Figure 6:
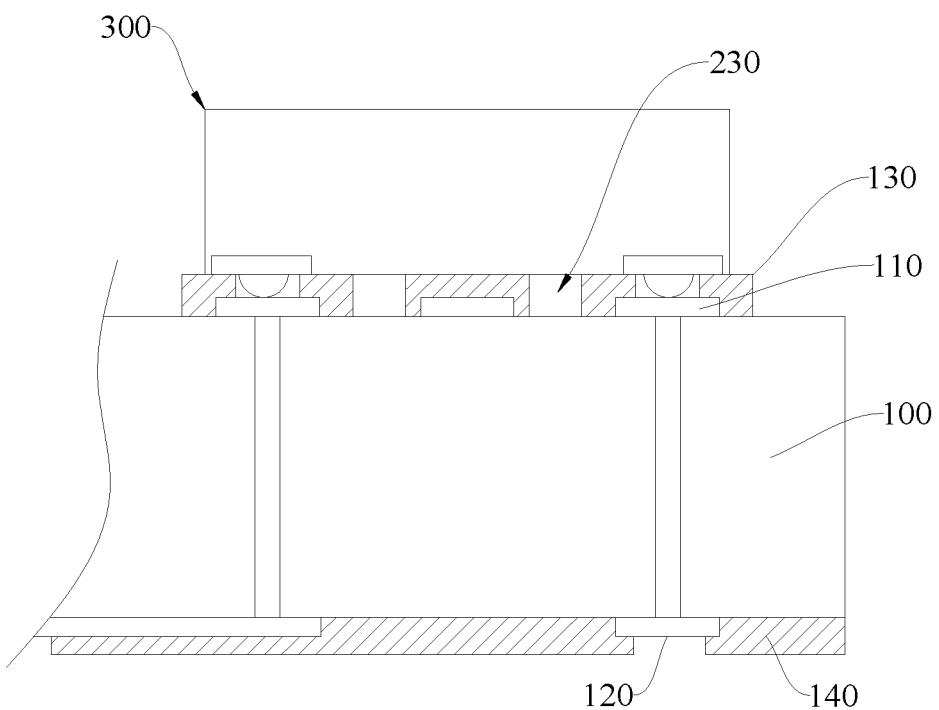
FIG. 6 is a schematic diagram of a second filter chip disposed on a substrate in an embodiment of the present application.

FIG. 6 is a schematic diagram of the second filter chip 300 disposed on the substrate 100 in an embodiment of the present application. As shown in FIGS. 2 and 6, in an embodiment, a groove 132 is formed on the first insulating protection layer 130 (as shown in FIG. 2) to expose at least a part of the circuits and a part of the surface of the substrate 100 (here, referring to the surface of the substrate 100 that is not covered by the first circuit layer 110), the second filter chip 300 is flip-mounted on the first surface, and the chip pins on the functional surface of the second filter chip 300 are connected to the circuits (first circuit layer 110) exposed by the groove 132 through bumps. A part of the functional surface of the second filter chip 300 abuts on the first insulating protection layer 130, and the other part forms a closed cavity 230 together with the surface of the substrate 100 exposed by the groove 132 and the sidewall of the groove 132. In this embodiment, the manner in which the closed cavity 230 is formed in the second filter chip 300 is that its own functional surface, the second insulating protection layer 140 and the surface of the substrate 100 jointly form the closed cavity. Therefore, when the second filter chip 300 is manufactured, it is not necessary to manufacture the wall structure 220 like the first filter chip 200.

Figure 7:
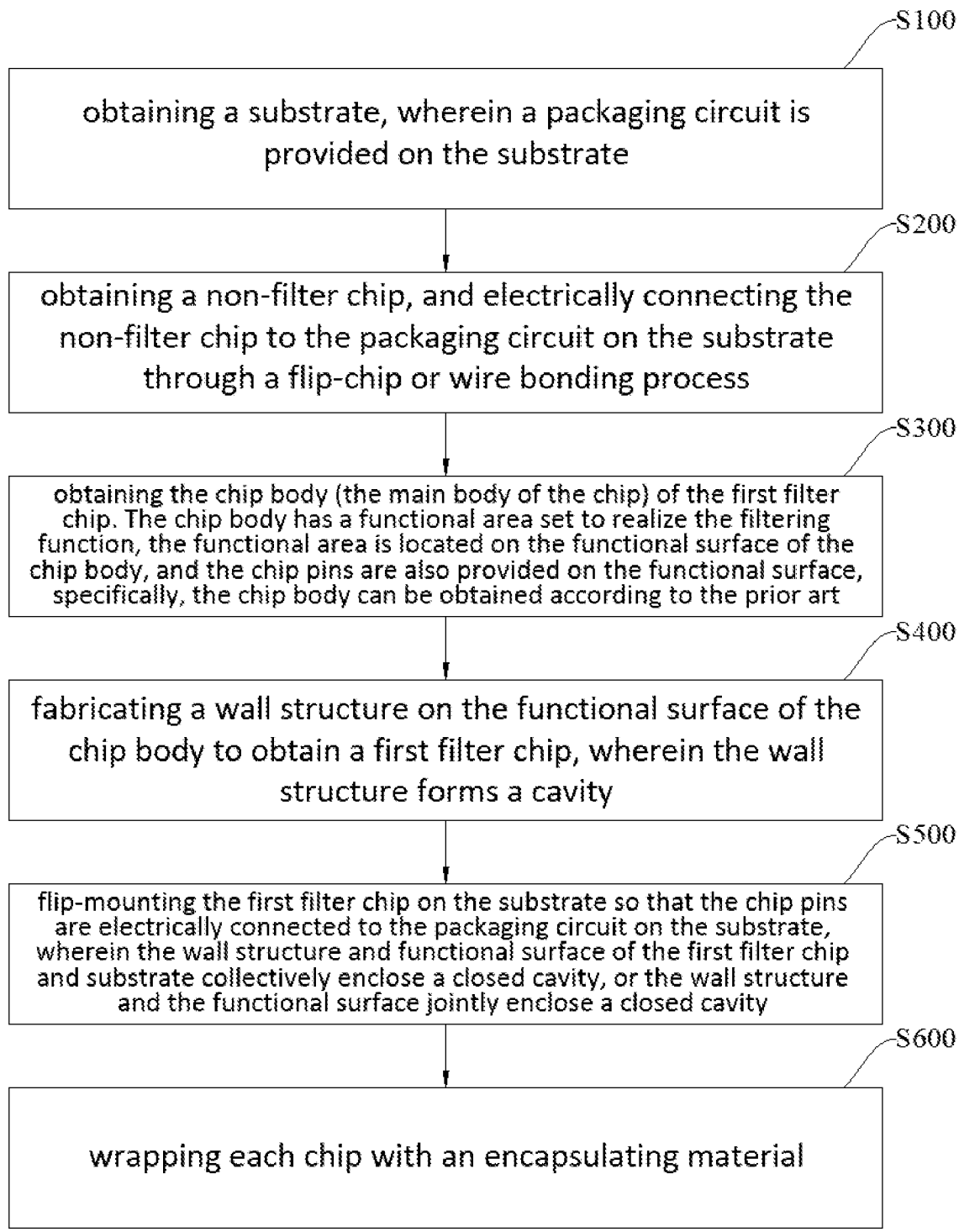
FIG. 7 is a flowchart of a manufacturing method of a filter radio-frequency module packaging structure in an embodiment of the present application.

FIG. 7 is a flowchart of a manufacturing method of a filter radio-frequency module packaging structure in an embodiment of the present application. As shown in FIG. 7, the manufacturing method of the filter radio-frequency module packaging structure 010 includes the following steps:

Step S100, obtaining a substrate, wherein a packaging circuit is provided on the substrate.

Taking the production of the filter radio-frequency module packaging structure 010 provided by the embodiment of the present application as an example, the substrate 100 can be produced by an existing process, and the packaging circuit can include the first circuit layer 110 and the second circuit layer 120 as shown in FIGS. 2 to 6. In the step of obtaining the substrate, an insulating protection layer may be used to selectively cover a part of the packaging circuit. The exposed circuits of the first circuit layer 110 can be connected to the chip, and the exposed circuits of the second circuit layer 120 can be connected to metal bumps.

Step S200, obtaining a non-filter chip, and electrically connecting the non-filter chip to the packaging circuit on the substrate through a flip-chip or wire bonding process.

In the embodiment of the present application, the non-filter chip 400 may be a radio frequency chip, a switch chip, or the like.

Step S300, obtaining the chip body (the main body of the chip) of the first filter chip. The chip body has a functional area set to realize the filtering function, the functional area is located on the functional surface of the chip body, and the chip pins are also provided on the functional surface. Specifically, the chip body can be obtained according to the prior art.

Step S400, fabricating a wall structure on the functional surface of the chip body to obtain a first filter chip, wherein the wall structure forms a cavity.

Taking the manufacturing of the filter radio-frequency module packaging structure 010 provided by the embodiment of the present application as an example, a wall structure 220 is provided on the chip body 210, and the wall structure 220 is used to form a cavity. The wall structure 220 may be the wall structure 220 of the embodiment shown in FIG. 3, including a dam 222, which forms a cavity with an opening, or the wall structure 220 in the embodiment of FIG. 4 and FIG. 5, including the dam 222 and the cover 224, wherein the dam 222 and the cover 224 form a closed cavity 230. Specifically, the method of forming the wall structure 220 may include spin-coating a photosensitive material (insulating material) on the chip body 210, and forming the wall structure 220 in the functional area after exposure and development (and curing). The wall structure 220 needs to expose at least a part of the chip pins 212. In addition, when the first filter chip 200 needs to be flip-mounted, the metal bumps 214 need to be provided at the exposed chip pins 212. If the first filter chip 200 is arranged in a front-mounting manner later, the bump 214 does not need to be mounted.

Of course, in the case where the non-filter chip 400 and the second filter chip 300 need to be mounted, related steps of obtaining the non-filter chip 400 and the second filter chip 300 are also included.

Step S500, flip-mounting the first filter chip on the substrate so that the chip pins are electrically connected to the packaging circuit on the substrate. The wall structure and functional surface of the first filter chip and substrate collectively enclose a closed cavity, or the wall structure and the functional surface jointly enclose a closed cavity.

In the embodiment of the present application, the first filter chip 200 is arranged in a flip-mounting manner, as shown in FIG. 3 and FIG. 4; it may also be front-mounted, as shown in FIG. 5. The chip pin 212 of the first filter chip 200 is electrically connected to the packaging circuit on the substrate 100. In this embodiment, the wall structure 220, the functional surface, and the substrate 100 may be used to jointly enclose a closed cavity 230, as shown in FIG. 3; or the wall structure 220 and the functional surface may be used to jointly enclose a closed cavity 230, as shown in FIGS. 4 and 5. In the case of front-mounting, the wire bonding process is used to electrically connect with the first circuit layer 110 of the substrate 100; and in the case of flip-mounting, it is electrically connected with the first circuit layer 110 of the substrate 100 through the bumps 214.

In addition, the non-filter chip 400 and the second filter chip 300 can be mounted as required, and both of them can be in a form of front-mounting (formal mounting) or flip-mounting (inverted mounting). Regarding the mounting manner of the second filter chip 300, reference may be made to the first filter chip 200, or the manner shown in the embodiment in FIG. 6.

Step S600, wrapping each chip with an encapsulating material.

After each chip is mounted on the substrate 100 (including the electrical connection and mechanical connection are completed), each chip is wrapped by the encapsulating material 500. Specifically, transfer molding, die-casting molding, injection molding, or vacuum coating processes can be used to wrap the encapsulating material 500 outside chips with different functions (in this embodiment, including the first filter chip 200, the second filter chip 300, and non-filter chip 400).

It should be understood that, in this embodiment, steps S300 to S400 may be performed simultaneously with steps S100 to S200, or completed before steps S100 to S200.

This application uses micro-nano processing technology and advanced packaging technology to integrate and package the filter bare chip, the radio frequency switch bare chip, the PA bare chip, the LNA bare chip, the duplexer bare chip, the antenna, and the like together to form an radio-frequency front end module, with a small size, a thinner thickness, low power consumption, good system performance, which fully meets the 5G technical requirements. The cost of the encapsulating material 500 is also low.

In summary, the present application provides a filter radio-frequency module packaging structure 010 and a manufacturing method thereof. The filter radio-frequency module packaging structure 010 includes a substrate 100, a first filter chip 200, and an encapsulating material 500, on the substrate 100 a packaging circuit is provided. The first filter chip 200 includes a chip body 210 and a wall structure 220 arranged on the chip body 210. The chip body 210 has a functional area set to realize the filtering function, and the functional area is located on the functional surface of the chip body 210. The functional surface is also provided with chip pins 212, the chip pins 212 are electrically connected to the packaging circuit on the substrate 100; the wall structure 220 is connected to the functional surface of the chip body 210; the wall structure 220, the functional surface and the substrate 100 jointly form a closed cavity 230, or the wall structure 220 and the functional surface jointly form a closed cavity 230; and the encapsulating material 500 wraps the first filter chip 200. By improving the design of the first filter chip 200, the wall structure 220 and the chip body 210 form a closed cavity 230, or the wall structure 220, the chip body 210 and the substrate 100 together form a closed cavity 230, the use of coating (glue film) can be reduced, and the encapsulating material 500 can be prevented from being too large in volume; meanwhile, the encapsulating material can be prevented from entering the cavity 230 and affecting the function of the chip.

The present application provides a filter radio-frequency module packaging structure, including a substrate, a first filter chip, and an encapsulating material, wherein a circuit is provided on the substrate. The first filter chip includes a chip body and a wall structure arranged on the chip body. The chip body has a functional area set to realize the filtering function, and the functional area is located on the functional surface of the chip body. The functional surface is also provided with pins, the pins are electrically connected to the circuit on the substrate; the wall structure is connected to the functional surface of the chip body; the wall structure, the functional surface and the substrate jointly form a closed cavity, or the wall structure and the functional surface jointly form a closed cavity; and the encapsulating material wraps the first filter chip. By improving the design of the first filter chip, the wall structure and the chip body form a closed cavity, or the wall structure, the chip body and the substrate together form a closed cavity, the use of coating (glue film) can be reduced, and the encapsulating material can be prevented from being too large in volume; meanwhile, the encapsulating material can be prevented from entering the cavity 230 and affecting the function of the chip.

The manufacturing method provided by the embodiment of the present application manufactures the above-mentioned filter radio-frequency module packaging structure.

The above are only the specific embodiments of the present application, but the protection scope of the present application is not limited thereto. Any person skilled in the art can easily think of changes or substitutions within the technical scope disclosed in the present application, which all should be covered within the scope of protection of this application. Therefore, the protection scope of this application shall be subject to the protection scope of the claims.

INDUSTRIAL APPLICABILITY

The present application can be applied to the semiconductor field, and provides a filter radio-frequency module packaging structure and a manufacturing method thereof, which can ensure that the filter radio-frequency module packaging structure has better performance and smaller encapsulating material volume.

What is claimed is:

1. A filter radio-frequency module packaging structure, comprising:
   a substrate; an encapsulating material; and at least two chips with different functions, wherein
   the at least two chips with different functions comprise a first filter chip, a packaging circuit is arranged on the substrate, and the first filter chip comprises a chip body and a wall structure arranged on the chip body of the first filter chip,
   the chip body of the first filter chip has a functional area configured to realize a filtering function, wherein the functional area is located on a functional surface of the chip body of the first filter chip, and chip pins of the first filter chip are provided on the functional surface,
   the first filter chip is flip-mounted on the substrate and the chip pins are electrically connected to the packaging circuit on the substrate,
   the wall structure is arranged on the functional surface of the chip body, and the wall structure, the functional surface and the substrate jointly form a closed cavity, or the wall structure and the functional surface jointly form a closed cavity,
   the at least two chips with different functions further comprise a non-filter chip, wherein the non-filter chip is electrically connected to the packaging circuit on the substrate through flip-mounting or wire bonding processes, and the encapsulating material and the substrate encapsulate the at least two chips with different functions.

2. The filter radio-frequency module packaging structure according to claim 1, wherein the first filter chip is flip-mounted on the substrate, the chip pins of the first filter chip are connected to the packaging circuit on a surface of the substrate through bumps, and the wall structure comprises a dam protruding from the functional surface, wherein the dam forms a cavity with an opening, and a side of the dam away from the chip body abuts against the substrate, so that the substrate blocks the opening of the cavity, and the dam, the functional surface, the encapsulating material and the substrate jointly form a closed cavity.

3. The filter radio-frequency module packaging structure according to claim 2, wherein the first filter chip comprises a plurality of functions of a filter device.

4. The filter radio-frequency module packaging structure according to claim 2, wherein the encapsulating material is formed by transfer molding, die-casting molding, injection molding, or vacuum coating process.

5. The filter radio-frequency module packaging structure according to claim 2, wherein the substrate comprises a first surface and a second surface opposite to each other, and the packaging circuit on the substrate comprises a first circuit layer located on the first surface and a second circuit layer located on the second surface, and the dam abuts against the first circuit layer, the bumps are connected to the first circuit layer.

6. The filter radio-frequency module packaging structure according to claim 2, wherein the at least two chips with different functions further comprise a second filter chip electrically connected to the packaging circuit on the substrate, wherein a closed cavity is formed at a functional surface of the second filter chip.

7. The filter radio-frequency module packaging structure according to claim 6, wherein the substrate comprises a first surface and a second surface opposite to each other, and the packaging circuit on the substrate comprises a first circuit layer located on the first surface and a second circuit layer located on the second surface, wherein an insulating protection layer is laid on the first surface, and a groove is formed on the insulating protection layer to expose at least a part of the packaging circuit and a part of a surface of the substrate, the second filter chip is flip-mounted on the first surface, pins on the functional surface of the second filter chip are connected to the packaging circuit exposed by the groove through bumps, and a part of the functional surface of the second filter chip abuts against the insulating protection layer, the other part forms a closed cavity with the surface of the substrate exposed from the groove, a sidewall of the groove, and the encapsulating material.

8. The filter radio-frequency module packaging structure according to claim 1, wherein the first filter chip comprises a plurality of functions of a filter device.

9. The filter radio-frequency module packaging structure according to claim 8, wherein the encapsulating material is formed by transfer molding, die-casting molding, injection molding, or vacuum coating process.

10. The filter radio-frequency module packaging structure according to claim 1, wherein the encapsulating material is formed by transfer molding, die-casting molding, injection molding, or vacuum coating process.

11. The filter radio-frequency module packaging structure according to claim 1, wherein the substrate comprises a first surface and a second surface opposite to each other, the circuit on the substrate comprises a first circuit layer located on the first surface and a second circuit layer located on the second surface, and the first filter chip is arranged on the first surface of the substrate, and the substrate further comprises an insulating protection layer laid on the first circuit layer and the second circuit layer, and at least a part of circuits of the first circuit layer and the second circuit layer is exposed from the insulating protection layer.

12. The filter radio-frequency module packaging structure according to claim 11, wherein the insulating protection layer has a flatness of 0-10 microns.

13. The filter radio-frequency module packaging structure according to claim 1, wherein the non-filter chip is a power amplifier, a radio frequency switch, a low noise amplifier, a filter duplexer or a power amplifier.

14. A method for manufacturing a filter radio-frequency module packaging structure, comprising following steps:
obtaining a substrate, wherein a packaging circuit is provided on the substrate;
obtaining a non-filter chip, and electrically connecting the non-filter chip with the packaging circuit on the substrate through flip-mounting or wire bonding processes;
obtaining a chip body of a first filter chip, wherein the chip body has a functional area configured to realize a filtering function, the functional area is located on a functional surface of the chip body, and chip pins are provided on the functional surface;
fabricating a wall structure on the functional surface of the chip body to obtain the first filter chip, and making the wall structure form a cavity;
flip-mounting the first filter chip on the substrate so that the chip pins are electrically connected to the packaging circuit on the substrate, wherein the wall structure and the functional surface of the first filter chip and the substrate jointly form a closed cavity, or the wall structure and the functional surface jointly form a closed cavity; and
wrapping each chip with an encapsulating material.

15. The method for manufacturing a filter radio-frequency module packaging structure according to claim 14, wherein the wall structure comprises a dam protruding from the functional surface, and the dam forms a cavity with an opening; and the flip-mounting the first filter chip on the substrate so that the chip pins are electrically connected to the packaging circuit comprises:
flip-mounting the first filter chip on the substrate, using the bumps to connect the chip pins of the chip body and the packaging circuit on the substrate, wherein a side of the dam away from the chip body abuts against the substrate, so that the substrate blocks the opening of the cavity, and the dam, the functional surface and the substrate jointly form a closed cavity.

16. The method for manufacturing a filter radio-frequency module packaging structure according to claim 14, wherein the wall structure comprises a dam protruding from the functional surface and a cover connected to the dam, wherein the dam forms a cavity with an opening, and the cover covers the opening of the cavity so that the dam, the cover and the functional surface jointly form a closed cavity.

17. The method for manufacturing a filter radio-frequency module packaging structure according to claim 14, wherein the encapsulating material is wrapped outside each chip by using transfer molding, die-casting molding, injection molding or vacuum coating processes.

18. The method for manufacturing a filter radio-frequency module packaging structure according to claim 14, wherein the obtaining a substrate further comprises: fabricating an insulating protection layer to selectively cover the packaging circuit.

\* \* \* \* \*